(12) United States Patent
Hanson et al.

(10) Patent No.: US 11,009,928 B2
(45) Date of Patent: May 18, 2021

(54) OPTIMIZING AIRFLOW IN A NETWORK DEVICE

(71) Applicant: Arista Networks, Inc., Santa Clara, CA (US)

(72) Inventors: Geoffrey Hanson, San Jose, CA (US); Vincent Cridlig, San Francisco, CA (US); Edward Chien, Los Altos, CA (US)

(73) Assignee: Arista Networks, Inc., Santa Clara, CA (US)

( * ) Notice: Subject to any disclaimer, the term of this patent is extended or adjusted under 35 U.S.C. 154(b) by 22 days.

(21) Appl. No.: 16/439,436

(22) Filed: Jun. 12, 2019

(65) Prior Publication Data

US 2020/0393882 A1 Dec. 17, 2020

(51) Int. Cl.
*G06F 1/20* (2006.01)
*H05K 7/20* (2006.01)

(52) U.S. Cl.
CPC ......... *G06F 1/206* (2013.01); *H05K 7/20136* (2013.01); *H05K 7/20209* (2013.01)

(58) Field of Classification Search
CPC ........... H05K 7/20836; H05K 7/20209; H05K 7/20136; F24F 2110/10; G05D 23/1931; F04D 25/166; F04D 27/004; G06F 1/206
See application file for complete search history.

(56) References Cited

U.S. PATENT DOCUMENTS

| 6,134,667 | A | * | 10/2000 | Suzuki | G06F 1/206 713/300 |
| 2008/0170947 | A1 | * | 7/2008 | Sutardja | G06F 1/206 417/32 |
| 2010/0085196 | A1 | * | 4/2010 | Stiver | H05K 7/20836 340/584 |
| 2012/0010754 | A1 | * | 1/2012 | Matteson | H05K 7/20836 700/282 |
| 2012/0218707 | A1 | * | 8/2012 | Chan | H05K 7/20836 361/679.48 |

(Continued)

OTHER PUBLICATIONS

U.S. Appl. No. 16/265,917, filed Feb. 1, 2019 (unpublished), 18 pages.

*Primary Examiner* — Kidest Bahta
(74) *Attorney, Agent, or Firm* — Fountainhead Law Group P.C.

(57) ABSTRACT

Techniques for optimizing airflow in a network device are provided. In one set of embodiments, a network device can identify one or more device components whose temperature thresholds may be adjusted to be higher (or in other words, more aggressive) than their normal values. The network device can then increase the temperature thresholds for those identified components and use the increased thresholds as static inputs to a fan control algorithm of the device. In another set of embodiments, the network device can check the current airflow within the device on a periodic basis. If the current airflow does not meet an airflow requirement, the network device can incrementally increase the temperature thresholds of the identified components, provide the increased thresholds to its fan control algorithm, and subsequently re-check the current airflow. These steps can repeat until the current airflow meets the airflow requirement.

20 Claims, 5 Drawing Sheets

(56) References Cited

U.S. PATENT DOCUMENTS

| | | | | |
|---|---|---|---|---|
| 2016/0192542 | A1* | 6/2016 | LeFebvre | H05K 7/20836 |
| | | | | 361/679.47 |
| 2017/0138628 | A1* | 5/2017 | Sondur | H05K 7/20836 |
| 2018/0003402 | A1* | 1/2018 | Lambert Grossi | F24F 11/30 |
| 2018/0217005 | A1* | 8/2018 | Kanodia | G06F 9/30003 |
| 2019/0361508 | A1* | 11/2019 | Yarragunta | H05K 7/20209 |

* cited by examiner

OPTIMIZING AIRFLOW IN A NETWORK DEVICE

BACKGROUND

In network devices that rely on fans for cooling, a fan control algorithm is used to regulate fan speeds. The fan control algorithm typically takes as input temperature thresholds associated with network device components and current operating temperatures of those components. Based on the temperature thresholds and current operating temperatures, the fan control algorithm determines how fast the fans should spin in order to avoid overheating.

In some cases, the temperature thresholds that are provided as input to the fan control algorithm for one or more particular components of a network device may be conservatively low. Such conservative thresholds can cause the network device's fans to spin faster than strictly necessary to keep the components within a safe temperature range, resulting in excessive airflow. This excessive airflow can be undesirable for certain device users, such as users that deploy the network device in environments with stringent airflow requirements (e.g., data centers).

SUMMARY

Techniques for optimizing the airflow in a network device are provided. In one set of embodiments, the network device can retrieve temperature threshold information for a plurality of components of the network device, the temperature threshold information including, for each component in the plurality of components, an overheat temperature threshold indicating a temperature at which the component will begin overheating. The network device can further identify a first component in the plurality of components that is not a candidate for aggressive thermal management; identify a second component in the plurality of components that is a candidate for aggressive thermal management; calculate a target temperature threshold for the first component by applying a first negative offset to the first component's overheat temperature threshold; and calculate a target temperature threshold for the second component by applying a second negative offset to the second component's overheat temperature threshold, the second negative offset being smaller in absolute magnitude than the first negative offset. The network device can then execute a fan control algorithm for controlling one or more cooling fans of the network device in accordance with the calculated target temperature thresholds for the first and second components.

In another set of embodiments, the network device can receive a user-defined airflow requirement, determine a target temperature threshold for a component of the network device that is a candidate for aggressive thermal management, and initiate execution of a fan control algorithm in accordance with the target temperature threshold for the component. After an interval, the network device can determine a current airflow within the device. Upon determining that the current airflow does not meet the airflow requirement, the network device can incrementally increase the target temperature threshold for the component and execute the fan control algorithm in accordance with the increased target temperature threshold.

The following detailed description and accompanying drawings provide a better understanding of the nature and advantages of particular embodiments.

DETAILED DESCRIPTION

In the following description, for purposes of explanation, numerous examples and details are set forth in order to provide an understanding of various embodiments. It will be evident, however, to one skilled in the art that certain embodiments can be practiced without some of these details or can be practiced with modifications or equivalents thereof.

1. Overview

Embodiments of the present disclosure are directed to techniques for optimizing airflow in a network device in a manner that ensures the device's components remain sufficiently cool, while at the same time meeting an airflow requirement (e.g., airflow less than or equal to X cubic feet per minute (CFM) per watt (W)).

According to one set of embodiments (referred to herein as the static optimization approach), a thermostat agent of the network device can identify one or more device components whose temperature thresholds may be adjusted to be higher (or in other words, more aggressive) than their normal values. The thermostat agent can then increase the temperature thresholds for those identified components and use the increased thresholds as static inputs to its fan control algorithm. The degree of the threshold increases can be based on component manufacturer, historical operation data, empirical testing that shows the increased thresholds reduce airflow within the network device to a level that meets the airflow requirement while avoiding overheat conditions, combinations of the same and/or the like.

According to another set of embodiments (referred to herein as the dynamic optimization approach), the thermostat agent can check the current airflow within the network device on a periodic basis. If the current airflow does not meet the airflow requirement, the thermostat agent can incrementally increase the temperature thresholds of the identified components, provide the increased thresholds to its fan control algorithm, and subsequently re-check the current airflow within the network device. This process of incrementing the temperature thresholds and re-checking the current airflow can repeat until the current airflow meets the airflow requirement or a maximum temperature threshold increase has been reached.

2. Example Network Device

Figure 1:
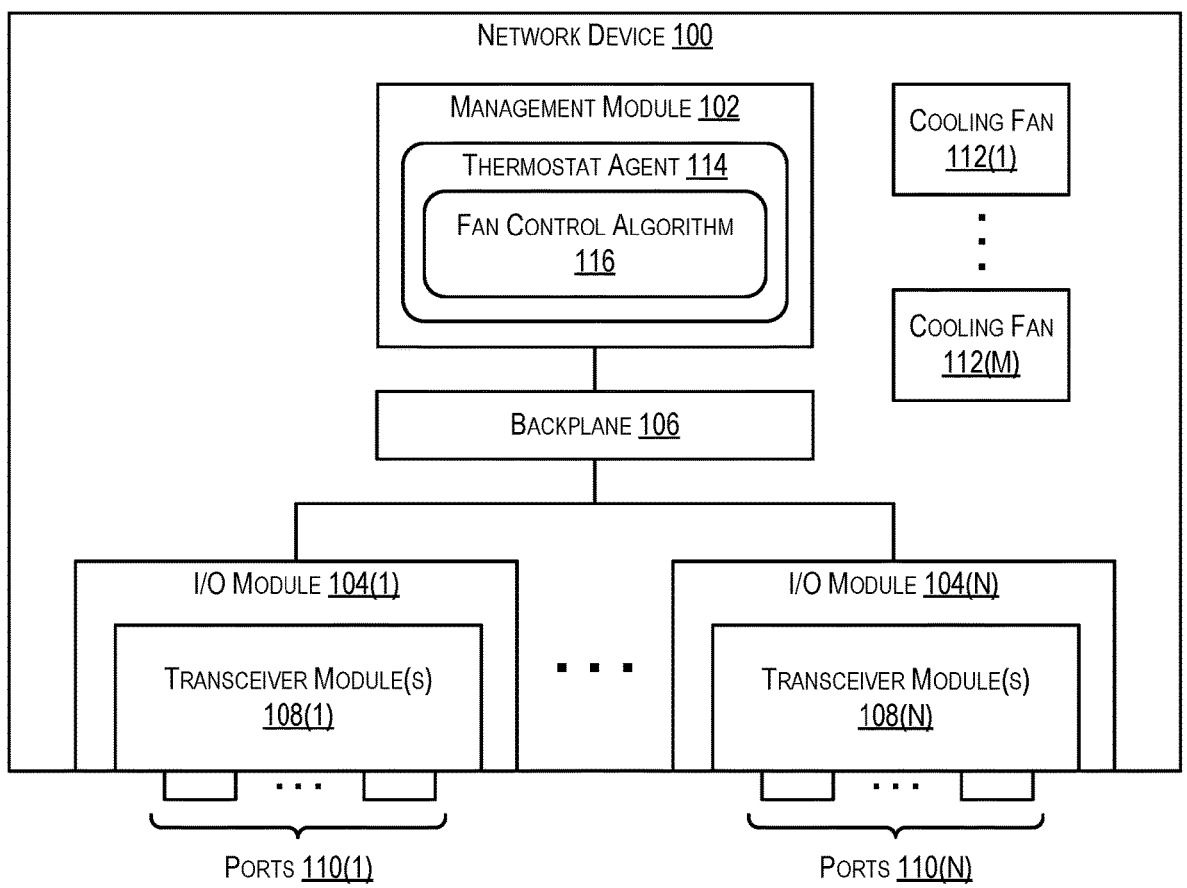
FIG. 1 depicts an example network device according to certain embodiments.

FIG. 1 is a simplified block diagram of an example network device 100 (e.g., a network switch or router) that can implement the airflow optimization techniques of the present disclosure. In one set of embodiments, network device 100 may be a modular chassis-based device that allows some or all of its internal components to be easily swapped into or out of the device chassis. In other embodiments network device 110 may be a fixed form factor device, such as a stackable switch.

As shown in FIG. 1, network device 100 includes a management module 102 that is communicatively coupled with a number of I/O (input/output) modules 104(1)-(N) via a backplane 106. Management module 102 is generally responsible for executing network control plane and device management functions via one or more general-purpose processors (not shown). Each of these general-purpose processors can operate under the control of a software image that is installed onto the device and maintained in an associated non-transitory memory.

I/O modules 104(1)-(N) are generally responsible for executing network data plane functions, such as receiving incoming network packets and forwarding outgoing network packets. I/O modules 104(1)-(N) can perform these data plane functions in cooperation with one or more transceiver modules 108(1)-(N) comprising I/O ports 110(1)-(N).

In addition to the foregoing, network device 100 includes an active cooling subsystem comprising one or more cooling fans 112(1)-(M) and a thermostat agent 114 running on the general-purpose processor(s) of management module 102. Cooling fans 112(1)-(M) can include one or more intake fans that pull outside air into network device 100 to cool the device interior and/or one or more exhaust fans that expel hot air inside network device 100 to the exterior. Thermostat agent 114 is configured to execute a fan control algorithm 116 that controls the rotational speeds of cooling fans 112(1)-(M) and thereby regulates the operating temperatures of various components within network device 100 (such as, e.g., management module 102, I/O modules 104(1)-(N), backplane 106, transceiver modules 108(1)-(N), etc.). In this way, thermostat agent 114 can keep those components near their ideal (or "target") temperatures and avoid component overheating.

Figure 2:
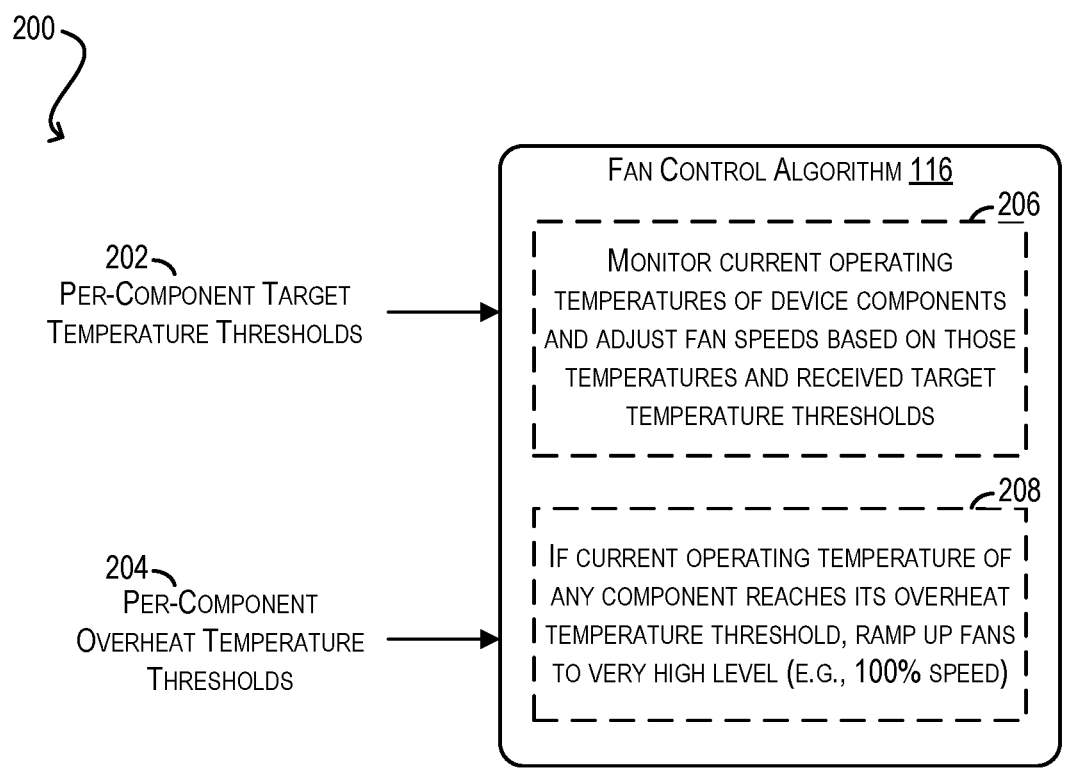
FIG. 2 depicts the high-level workflow of an example fan control algorithm according to certain embodiments.

To clarify how fan control algorithm 116 works, FIG. 2 is a schematic diagram 200 illustrating the general workflow of the algorithm according to certain embodiments. As shown in FIG. 2, fan control algorithm 116 receives, as input from thermostat agent 114, per-component target temperature thresholds 202 and per-component overheat temperature thresholds 204. In a particular embodiment, thermostat agent 114 can retrieve overheat temperature thresholds 204 (as well as critical temperature thresholds) from the components of network device 100 and calculate the target temperature threshold for each component by applying some negative offset to the component's overheat temperature threshold.

At reference numeral 206, fan control algorithm 116 monitors the current operating temperatures of the device's components and adjusts the speeds of cooling fans 112(1)-(M) in order to keep the components' operating temperatures close to their respective target temperature thresholds or within a given temperature range. For instance, in one embodiment fan control algorithm 116 can spin fans 112(1)-(M) progressively faster as the operating temperatures of the components climb higher than their target temperature thresholds, in an effort to stop or reverse the temperature increase.

Further, if the current temperature of any component reaches its overheat temperature threshold (reference numeral 208), fan control algorithm 116 can immediately ramp up cooling fans 112(1)-(M) to a very high level (e.g., 100% speed) in order to rapidly cool down that component and prevent the component from reaching its critical temperature threshold (at which point the component may be disabled).

As mentioned previously, in some scenarios the temperature thresholds that are provided as input to fan control algorithm 116 for certain device components may be conservatively low. For instance, for various reasons, transceiver modules manufactured by some vendors may report overheat and critical temperature thresholds that are lower than those reported by relatively similar transceiver modules manufactured by other vendors. If transceiver modules of the former type are installed into network device 100, those lower thresholds will be provided as input to fan control algorithm 116 and cause the algorithm to run cooling fans 112(1)-(M) at a faster average speed, resulting in increased airflow within the device. This, in turn, can cause problems for device users that prefer, or need, this airflow to remain below some level.

For example, some device users may deploy network device 100 in an operating environment that is subject to strict airflow requirements, such as a data center. As another example, some device users may wish to keep the amount of noise generated by network device 100, including airflow noise, below a defined level. As yet another example, some device users may wish to minimize device power usage, in which case reducing fan speed and airflow can reduce the total power draw of the device. As yet another example, some device users may wish to extend the life of cooling fans 112(1)-(M) as much as possible, or reduce the amount of external contaminants that are pulled into the device interior.

To address the foregoing and other similar preferences/needs, in various embodiments thermostat agent 114 of FIG. 1 can implement two different airflow optimization approaches: a static approach and a dynamic approach. With the static optimization approach (detailed in section (3) below), thermostat agent 114 can increase the target temperature thresholds and/or overheat temperature thresholds for specific components of network device 100 that are identified as being candidates for more aggressive thermal management (referred to hereinafter as "aggressive management candidates"). Such aggressive management candidates can include, e.g., the low-threshold transceiver modules noted above. Thermostat agent 114 can then provide these increased thresholds as input to fan control algorithm 116 in a static manner (in other words, a single time), and fan control algorithm 116 can carry out its fan speed regulation based on these increased thresholds. Because the thresholds for the aggressive management candidates will be higher than their normal values, the average speeds of cooling fans 112(1)-(M) and thus the overall airflow within network device 100 will be reduced. The extent to which the thresholds of the aggressive management candidates are increased in this static approach may be determined by measuring the airflow within network device 100 in a test environment with different component threshold values until some target airflow requirement is met. Alternatively or in addition, the threshold increases may be determined based on the make, model, and/or manufacturer of the aggressive management candidates and/or network device 100, historical operational data of the aggressive management candidates and/or network device 100, and/or other information.

With the dynamic optimization approach (detailed in section (4) below), thermostat agent 114 can provide an initial set of per-component target and/or overheat temperature thresholds for the aggressive management candidates to fan control algorithm 116 and fan control algorithm 116 can run using these initial thresholds. The initial thresholds can be normal thresholds or the increased thresholds determined via the static approach above. Then, on a periodic basis thermostat agent 114 can check the current airflow in network device 100 and determine whether the current airflow meets an airflow requirement. If so, fan control algorithm 116 can continue running with the existing thresholds. However, if the current airflow exceeds the airflow requirement, thermostat agent 114 can incrementally increase the target and/or overheat thresholds for the aggressive management candidates, provide the newly increased thresholds to fan control algorithm 116, and re-check the current airflow after some interval. This process can continue until the airflow requirement is met (or until a component overheats, at which point cooling fans 112(1)-(M) can be spun at, e.g., 100% to quickly cool down the component).

It should be appreciated that network device 100 of FIG. 1 is illustrative and not intended to limit embodiments of the present disclosure. For example, although thermostat agent 114 is shown as running on management module 102, in alternative embodiments thermostat agent 114 may be implemented elsewhere within network device 100 or potentially on a remote device/machine that is communicatively coupled with device 100. Further, thermostat agent 114 is not limited to software embodiments and can be implemented in specialized hardware or a combination of hardware and software.

As another example, although FIG. 1 depicts a certain set of components within network device 100, the airflow optimization techniques of the present disclosure may be applied to modify the temperature thresholds of other types of network device components that are not specifically described. One of ordinary skill in the art will recognize other variations, modifications, and alternatives.

3. Static Optimization

Figure 3:
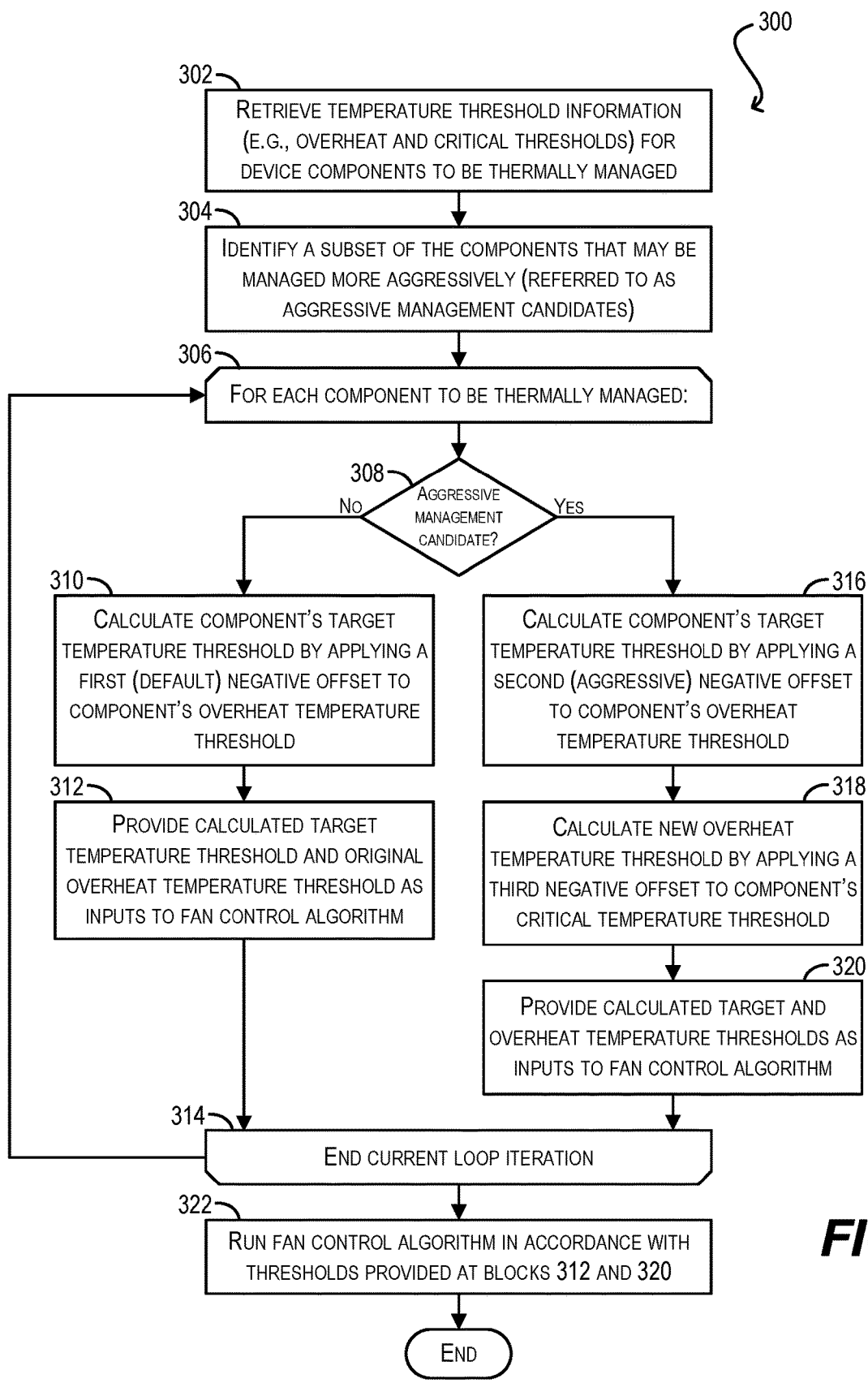
FIG. 3 depicts a flowchart for implementing the static optimization approach of the present disclosure according to certain embodiments.

FIG. 3 is a flowchart 300 that may be performed by thermostat agent 114 of FIG. 1 for implementing the static optimization approach according to certain embodiments. Flowchart 300 may be executed upon device boot-up or at other times, such as in response to a user-provided command to begin airflow optimization.

Starting with block 302, thermostat agent 114 can retrieve temperature threshold information pertaining to the components of network device 100 whose operating temperatures should be monitored and managed. Examples of such components include management module 102 (and/or sub-components thereof), I/O modules 104(1)-(N) (and/or sub-components thereof), backplane 106 (and/or sub-components thereof), and transceiver modules 108(1)-(N) (and/or sub-components thereof).

The temperature threshold information that is retrieved for each component at block 302 can include an overheat temperature threshold indicating a temperature at which the component will begin overheating and a critical temperature threshold indicating a temperature at which the component can no longer operate safely or reliably and thus should be shut down. In one set of embodiments, thermostat agent 114 can retrieve this temperature threshold information by communicating directly with each component. In other embodiments, thermostat agent 114 can retrieve the temperature threshold information from one or more other sources, such as a local or remote component database.

By way of example, the following table lists overheat and critical temperature thresholds that may be retrieved for two components C1 and C2:

TABLE 1

| Component | Overheat Temperature Threshold | Critical Temperature Threshold |
|---|---|---|
| C1 | 55 degrees Celsius | 58 degrees Celsius |
| C2 | 58 degrees Celsius | 60 degrees Celsius |

At block 304, thermostat agent 114 can identify, from among the components to be thermally managed, a subset of those components that can be managed more aggressively than the others (i.e., aggressive management candidates). Thermostat agent 114 can perform this identification in a number of different ways. For instance, in one set of embodiments thermostat agent 114 can identify aggressive management candidates as components whose overheat or critical temperature threshold meets some criterion, such as being below a low watermark (e.g., 55 degrees Celsius). Alternatively, thermostat agent 114 can identify aggressive management candidates based on a defined component list (e.g., components of a certain type, manufacturer, make, or model).

Upon identifying aggressive management candidates, thermostat agent 114 can enter a loop 306 for each component to be thermally managed. Within the loop, thermostat agent 114 can check whether the current component is an aggressive management candidate, per the identification performed at block 304 (block 308). If the answer is no, thermostat agent 114 can calculate a target temperature threshold for the current component by applying a first (default) negative offset to the component's overheat temperature threshold (e.g., −6 degrees Celsius) (block 310). As mentioned previously, this target temperature threshold is used by fan control algorithm 116 as a starting threshold for progressively increasing the speeds of cooling fans 112(1)-(M).

Thermostat agent 114 can then provide the calculated target temperature threshold and original overheat temperature threshold for the current component as inputs to fan control algorithm 116 (block 312) and the current loop iteration can end (block 314). For example, assume that component C2 in Table 1 is not an aggressive management candidate (referred to as a "non-aggressive management candidate"). In this case, thermostat agent 114 can calculate the target temperature threshold for C2 as being 58 (overheat threshold)−6(first offset)=52 degrees Celsius and provide this calculated target threshold, along with C2's original overheat temperature threshold of 58 degrees Celsius, to fan control algorithm 116.

On the other hand, if the current component is determined to be an aggressive management candidate at block 308, thermostat agent 114 can calculate the target temperature threshold for the current component by applying a second (aggressive) negative offset to the component's overheat temperature threshold (block 316). This second negative offset can be smaller in absolute magnitude than the first negative offset applied at block 310, such as −2 degrees Celsius, resulting in a higher (and thus more aggressive) target temperature threshold for the component.

Additionally, at block 318, thermostat agent 114 can calculate a new overheat temperature threshold for the current component by applying a third negative offset (e.g., −2 degrees Celsius) to the component's critical temperature threshold (block 318). In most cases, this calculation will result in a new overheat temperature threshold that is higher (and thus more aggressive) than the component's original overheat temperature threshold.

Thermostat agent 114 can then provide the calculated target temperature threshold and calculated overheat temperature threshold for the current component as inputs to fan control algorithm 116 (block 320) and the current loop iteration can end (block 314). For example, assume that component C1 in Table 1 is an aggressive management candidate. In this case, thermostat agent 114 can calculate the target temperature threshold for C1 as being 55 (original overheat threshold)−2 (second offset)=53 degrees Celsius, calculate the new overheat temperature threshold for C1 has being 58 (critical threshold)−2 (third offset)=56 degrees Celsius, and provide these two calculated thresholds to fan control algorithm 116.

Finally, once all of the components have been processed per loop 306, thermostat agent 114 can run fan control algorithm 116 in accordance with the component thresholds provided at blocks 312 and 320 (block 322). Note that because the target and overheat temperature thresholds for the aggressive management candidates are more aggressive than they normally would be, the overall airflow created by fan control algorithm 116 and the operation of cooling fans 112(1)-(M) will be reduced in comparison to network devices that do not implement this optimization technique. The exact values of the second and third offsets described above can be determined in the various way mentioned above in order to identify the specific values that meet a desired airflow requirement, while also minimizing overheat scenarios (in other words, scenarios where a component reaches its overheat temperature threshold). In certain embodiments, the second and third offsets can be calculated as percentages of the overheat and/or critical temperature thresholds, a percentage of the first (default) offset, or in other ways.

It should be appreciated that flowchart 300 is illustrative and various modifications are possible. For example, in some cases the use of aggressive thresholds may only be desired for certain types or models of network devices. In these embodiments, at the start of flowchart 300 thermostat agent 114 can check whether the current network device falls within that group. If not, thermostat agent 114 can simply treat every component of the device as a non-aggressive management candidate and calculate their target temperature thresholds using the first (default) negative offset.

As another example, in certain embodiments the target temperature thresholds calculated at blocks 310 and 316 can be further adjusted based on the ambient temperature around network device 100. For instance, the target temperature threshold may be adjusted upward if the ambient temperature is below a certain level. The degree of this adjustment can be the same or can differ for aggressive management candidates and non-aggressive management candidates.

As another example, in certain embodiments the critical temperature thresholds of the aggressive management candidates can be adjusted upward if they are determined to be too low (e.g., below some low watermark). In these embodiments, the adjustment of the overheat temperature threshold performed at block 318 can be performed based on either the original critical temperature threshold or the adjusted critical temperature threshold.

As yet another example, although flowchart 300 assumes that thermostat agent 114 only retrieves overheat and critical temperature thresholds for the components of network device 100 at block 302, in some cases thermostat agent 114 may also retrieve target temperature thresholds for the components. This may occur if, for instance, the vendors of those components have specified particular target thresholds. In these cases, instead of calculating the target temperature thresholds for aggressive management candidates and non-aggressive management candidates using differing negative offsets from their respective overheat temperature thresholds, thermostat agent 114 can simply adjust the target temperature thresholds for the aggressive management candidates by some positive offset to make the target temperature thresholds more aggressive (and leave the target temperature thresholds for the non-aggressive management candidates as-is).

4. Dynamic Optimization

Figure 4:
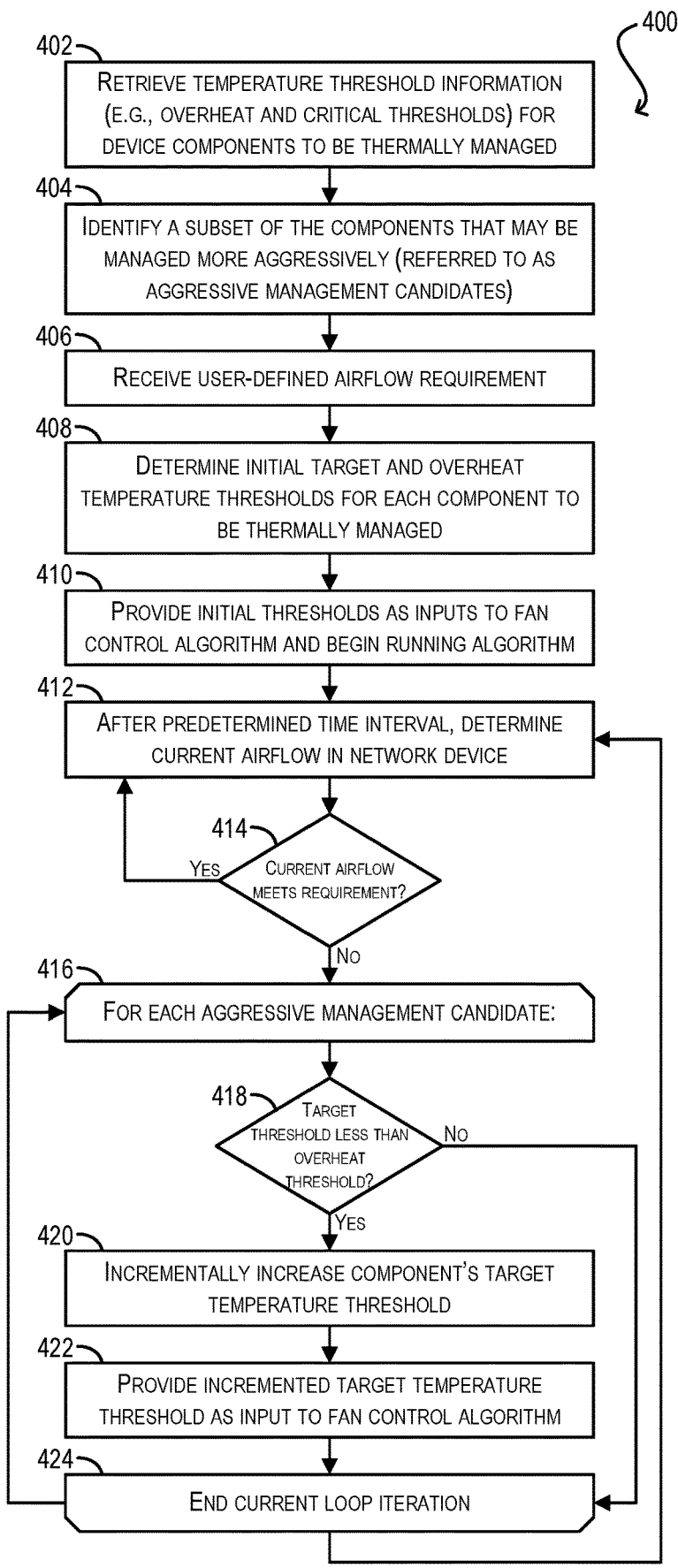
FIGS. 4 and 5 depict flowcharts for implementing the dynamic optimization approach of the present disclosure according to certain embodiments.
Figure 5:
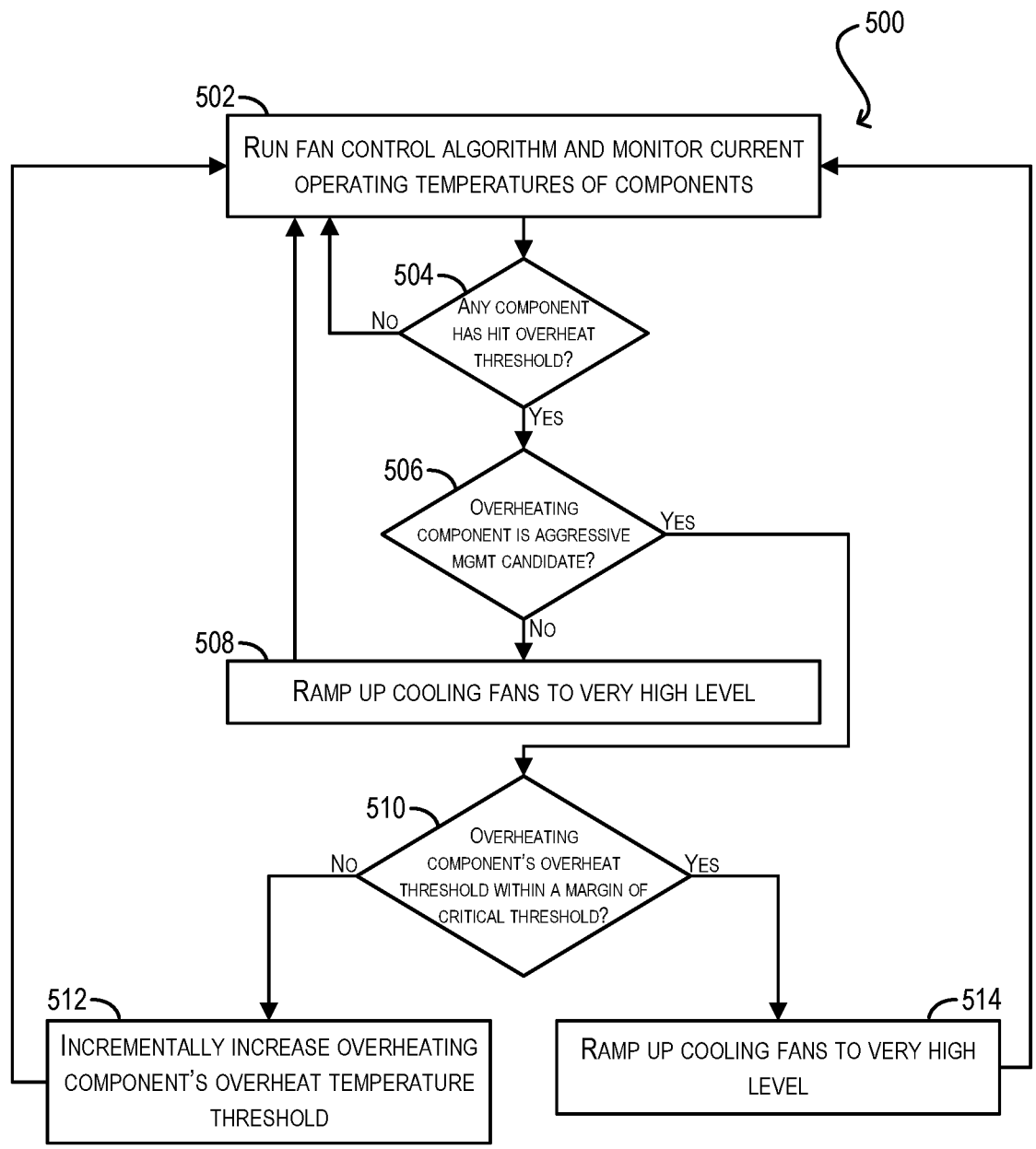

FIGS. 4 and 5 depict flowcharts 400 and 500 that may be performed by thermostat agent 114 of FIG. 1 for implementing the dynamic optimization approach according to certain embodiments. Like flowchart 300, flowcharts 400 and 500 may be executed upon device boot-up or at other times, such as in response to a user-provided command to begin airflow optimization.

Starting with blocks 402 and 404 of flowchart 400, thermostat agent 114 can retrieve temperature threshold information (e.g., overheat and critical thresholds) for the components of network device 100 whose operating temperatures should be monitored/managed and can identify, from among those components, aggressive management candidates. These steps are substantially similar to blocks 302 and 304 of flowchart 300.

At block 406, thermostat agent 114 can receive a user-defined airflow requirement for network device 100. In a particular embodiment, this airflow requirement may be expressed as a maximum allowable airflow per unit power, such as 0.2 CFM/W.

At block 408, thermostat agent can determine initial target and overheat temperature thresholds for each of the components to be thermally managed. In one set of embodiments, this step can involve performing the steps shown within loop 306 of flowchart 300—namely, checking whether the component is an aggressive management candidate and determining the target and/overheat temperature thresholds for the component using the appropriate negative offsets described in that flowchart. In other embodiments, block 408 can involve treating each component as a non-aggressive management candidate and thus calculating the initial target temperature threshold for the component using the previously-described first (default) negative offset.

Thermostat agent 114 can then provide the initial per-component target and overheat temperature thresholds to fan control algorithm 116 and begin running the algorithm in accordance with these initial thresholds (block 410).

After running fan control algorithm 116 for a predetermined time interval (e.g., one minute), thermostat agent 114 can determine the current airflow in network device 100 in terms of, e.g., CFM/W (block 412). In scenarios where network device 100 includes an airflow sensor, this can be achieved by retrieving the current airflow in CFM via the airflow sensor, retrieving the current power consumption of network device 100 in watts from the device's power supply, and dividing the former by the latter. Alternatively, in scenarios where network device 100 does not have an airflow sensor, the current airflow in CFM can be determined by retrieving the current fan speeds of cooling fans 112(1)-(M) and translating those fan speeds into a CFM value via a calculation or a conversion table resident on the device.

Once thermostat agent 114 has determined the current airflow, the agent can check whether that current airflow meets (e.g., is equal to or less than) the user-defined airflow requirement received at block 406 (block 414). If the answer is yes, flowchart 400 can loop back to block 412 and re-check the current airflow after a time interval has expired or an event is triggered. As long as the current airflow in network device 100 remains equal to or below the airflow requirement, fan control algorithm 116 can operate in a steady state where the per-component target and overheat temperature thresholds used by the algorithm remain constant.

However, if the current airflow does not meet the user defined airflow requirement at block 414, thermostat agent 114 can enter a loop 416 for each aggressive management candidate. Within this loop, thermostat agent 114 can check whether the component's current target temperature threshold is less than its current overheat temperature threshold (block 418). If the answer is yes, thermostat agent 114 can increase the component's target temperature threshold by an incremental amount (e.g., 1 degree Celsius) (block 420), provide this increased target temperature threshold as input to fan control algorithm 116 (block 422), and reach the end of the current loop iteration (block 424). In this way, thermostat agent 114 can make the component's target temperature threshold slightly more aggressive and thereby attempt to reduce the airflow within network device 100.

On the other hand, if the component's current target temperature threshold has already reached its overheat temperature threshold at block 418, thermostat agent 114 can simply proceed to the end of the loop iteration because this component's target temperature threshold cannot be safely increased any further.

Once all of the aggressive management candidates have been processed per loop 416, thermostat agent 114 can return to block 412 to re-check the current airflow within network device 100 after the time interval has passed or an event has occurred, and the subsequent steps can repeat as needed.

Turning now to FIG. 5, concurrently with the execution of blocks 412-424 of flowchart 400, thermostat agent 114 can run fan control algorithm 116 and monitor the current operating temperatures of the components of network device 100 (block 502). As part of this process, thermostat agent 114 can determine whether any component has hit its overheat temperature threshold (block 504). If the answer is no, thermostat agent 114 can go back to monitoring temperatures per block 502.

However, if the answer at block 504 is yes, thermostat agent 114 can further check whether the overheating component is an aggressive management candidate (block 506). If the answer at block 506 is no, thermostat agent 114 can perform the default action of ramping up cooling fans 112(1)-(M) to a very high level (e.g., 100%) in an attempt to quickly reduce the component's temperature (block 508) and return to block 502.

If the answer at block 506 is yes (i.e., the overheating component is an aggressive management candidate), thermostat agent 114 can further check whether the current overheat temperature threshold for that component is within some predefined margin of its critical temperature threshold (e.g., within 2 degrees Celsius of the critical threshold) (block 510). If the answer at block 510 is no, thermostat agent 114 can increase the component's overheat temperature threshold by an incremental amount (e.g., 1 degree Celsius) (block 512) and return to block 502.

Otherwise, thermostat agent 114 can conclude that the current operating temperature of the overheating component is too close to its critical temperature threshold. Thus, at block 514 thermostat agent 114 can ramp up cooling fans 112(1)-(M) to a very high level in a manner similar to block 508 and subsequently return to block 502.

It should be appreciated that flowcharts 400 and 500 are illustrative and various modifications are possible. For example, in some embodiments flowchart 400 (which pertains to the dynamic increase of target temperature thresholds for aggressive management candidates) may be implemented without flowchart 500 (which pertains to the dynamic increase of overheat temperature thresholds for aggressive management candidates). Conversely, in some embodiments flowchart 500 may be implemented without flowchart 400.

Further, in some embodiments the pool of aggressive management candidate components may be segmented into one group that allows for the dynamic increase of the components' target temperature thresholds and another (potentially overlapping) group that allows for the dynamic increase of the components' overheat temperature thresholds. Stated another way, each aggressive management candidate can be defined as (1) allowing the dynamic increase of its target temperature threshold, (2) allowing the dynamic increase of its overheat temperature threshold, or both (1) and (2). Thermostat agent 114 can then carry out flowcharts 400 and 500 in accordance with these definitions.

Yet further, in some embodiments the dynamic increases of target temperature thresholds and/or overheat temperature thresholds shown in FIGS. 4 and 5 may be performed with respect to every component within network device 100 (and not just the aggressive management candidates). In embodiments where every device component can have its target and overheat temperature thresholds dynamically adjusted, the step of identifying aggressive management candidates at block 404 can be omitted.

The above description illustrates various embodiments of the present disclosure along with examples of how aspects of these embodiments may be implemented. The above examples and embodiments should not be deemed to be the only embodiments, and are presented to illustrate the flexibility and advantages of the present disclosure as defined by the following claims. For example, although certain embodiments have been described with respect to particular workflows and steps, it should be apparent to those skilled in the art that the scope of the present disclosure is not strictly limited to the described workflows and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in hardware can also be implemented in software and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the present disclosure as set forth in the following claims.

What is claimed is:

1. A method comprising:
retrieving, by a network device, temperature threshold information for a plurality of components of the network device, the temperature threshold information including, for each component in the plurality of components, an original overheat temperature threshold indicating a temperature at which the component will begin overheating;
calculating, by the network device, a target temperature threshold for a first component in the plurality of components by applying a first negative offset to the original overheat temperature threshold of the first component;
calculating, by the network device, a target temperature threshold for a second component in the plurality of components by applying a second negative offset to the original overheat temperature threshold of the second component, the second negative offset causing a percentage change in the original overheat temperature threshold of the second component to provide for aggressive thermal management of the second component while the first negative offset causes a percentage change in the original overheat temperature threshold of the first component to provide for thermal management of the first component; and executing, by the network device, a fan control algorithm for controlling one or more cooling fans of the network device in accordance with the calculated target temperature thresholds for the first and second components to thereby control an airflow within the network device.

2. The method of claim 1 wherein the calculated target temperature thresholds for the first and second components cause an amount of airflow within the network device to meet a predefined airflow requirement during the executing of the fan control algorithm.

3. The method of claim 1 wherein the temperature threshold information for the plurality of components is retrieved by communicating with each component.

4. The method of claim 1 wherein the temperature threshold information for the plurality of components is retrieved from a component database.

5. The method of claim 1 wherein the second component is identified as being a candidate for aggressive thermal management based on a comparison of the original overheat temperature threshold of the second component with a low threshold.

6. The method of claim 1 wherein the second component is identified as being a candidate for aggressive thermal management based on a manufacturer, make, or model indicator of the second component.

7. A network device comprising:
a processor; and
a memory have stored thereon program code that, when executed by the processor, causes the processor to:
retrieve temperature threshold information for a component of the network device, the temperature threshold information including, an overheat temperature threshold indicating a temperature at which the component will begin overheating;
identify whether the component will undergo normal thermal management or aggressive thermal management;
when the component is identified for normal thermal management, calculate a first target temperature threshold for the component by applying a first negative offset to the component's overheat temperature threshold;
when the component is identified for aggressive thermal management, calculate a second target temperature threshold for the component by applying a second negative offset to the component's overheat temperature threshold, the second negative offset having a value relative to a value of the first negative offset so that the calculated first target temperature threshold is less than the calculated second target temperature threshold; and
execute a fan control algorithm for controlling one or more cooling fans of the network device in accordance with the calculated first or second target temperature threshold for the component.

8. The network device of claim 7 wherein the temperature threshold information for the component further includes a critical temperature threshold indicating a temperature at which the component should be shut down.

9. The network device of claim 8 wherein the program code further causes the processor to, when the component is identified for aggressive thermal management:
calculate a new overheat temperature threshold for the component by applying a third negative offset to the component's critical temperature threshold; and
execute the fan control algorithm in accordance with the new overheat temperature threshold for the component.

10. The network device of claim 7 wherein the program code further causes the processor to, when the component is identified for normal thermal management:
provide the overheat temperature threshold for the component as input to the fan control algorithm; and
execute the fan control algorithm in accordance with the overheat temperature threshold for the component.

11. The network device of claim 7 wherein the program code further causes the processor to:
receive a user-defined airflow requirement;
determine, after an interval from initiating execution of the fan control algorithm, a current airflow within the network device; and
upon determining that the current airflow does not meet the airflow requirement, incrementally increase the first or second target temperature threshold for the component and execute the fan control algorithm in accordance with the increased first or second target temperature threshold.

12. A non-transitory computer readable storage medium having stored thereon program code executable by a network device, the program code comprising:
code that causes the network device to receive a user-defined airflow requirement;
code that causes the network device to determine a target temperature threshold for a component of the network device;
code that causes the network device to initiate execution of a fan control algorithm in accordance with the target temperature threshold for the component;
code that causes the network device to determine, after an interval from initiating execution of the fan control algorithm, a current airflow within the network device; and
code that causes the network device to, upon determining that the current airflow does not meet the user-defined airflow requirement, incrementally increase the target temperature threshold for the component and execute the fan control algorithm in accordance with the increased target temperature threshold to thereby reduce the current airflow within the network device until the current airflow meets the user-defined airflow requirement.

13. The non-transitory computer readable storage medium of claim 12 wherein the code that causes the network device to determine the target temperature threshold for the component comprises:
code that causes the network device to retrieve a overheat temperature threshold for the component, the overheat temperature threshold indicating a temperature at which the component will begin overheating; and
code that causes the network device to calculate the target temperature threshold by applying a negative offset to the overheat temperature threshold.

14. The non-transitory computer readable storage medium of claim 13 wherein the negative offset has a smaller magnitude than magnitudes of negative offsets applied for components of the network device that are not candidates for aggressive thermal management.

15. The non-transitory computer readable storage medium of claim 12 wherein the code that causes the network device to determine the current airflow within the network device comprises:
    code that causes the network device to determine current fan speeds of one or more cooling fans in the network device; and
    code that causes the network device to convert the current fan speeds into an airflow value using a conversion table.

16. The non-transitory computer readable storage medium of claim 12 wherein the program code further comprises:
    code that causes the network device to, upon incrementally increasing the target temperature threshold for the component and executing the fan control algorithm in accordance with the increased target temperature threshold, re-determine the current airflow after the predetermined time interval has passed again.

17. The non-transitory computer readable storage medium of claim 12 wherein the target temperature threshold for the component is not incrementally increased if the target temperature threshold matches an overheat temperature threshold for the component.

18. The non-transitory computer readable storage medium of claim 12 wherein the program code further comprises:
    code that causes the network device to determine that a current operating temperature of the component has reached an overheat temperature threshold for the component; and
    code that causes the network device to check whether the overheat temperature threshold is within a predefined margin of a critical temperature threshold for the component.

19. The non-transitory computer readable storage medium of claim 18 wherein the program code further comprises:
    code that causes the network device to, upon determining that the overheat temperature threshold is within the predefined margin of the critical temperature threshold, increase speeds of one or more cooling fans of the network device to maximum speeds of the one or more cooling fans.

20. The non-transitory computer readable storage medium of claim 18 wherein the program code further comprises:
    code that causes the network device to, upon determining that the overheat temperature threshold is not within the predefined margin of the critical temperature threshold, incrementally increase the overheat temperature threshold.

* * * * *